(12) United States Patent
Norte

(10) Patent No.: US 11,039,529 B2
(45) Date of Patent: Jun. 15, 2021

(54) COVER PLATES THAT ATTENUATE ELECTROSTATIC DISCHARGE AT PRINTHEADS

(71) Applicant: Andrew David Norte, Westminster, CO (US)

(72) Inventor: Andrew David Norte, Westminster, CO (US)

(73) Assignee: Ricoh Company, Ltd., Tokyo (JP)

( * ) Notice: Subject to any disclaimer, the term of this patent is extended or adjusted under 35 U.S.C. 154(b) by 338 days.

(21) Appl. No.: 15/896,880

(22) Filed: Feb. 14, 2018

(65) Prior Publication Data

US 2019/0254159 A1  Aug. 15, 2019

(51) Int. Cl.
| | | |
|---|---|---|
| *B41J 2/14* | (2006.01) | |
| *H05K 1/02* | (2006.01) | |
| *H05K 9/00* | (2006.01) | |
| *B41J 2/16* | (2006.01) | |

(52) U.S. Cl.
CPC .......... *H05K 1/0259* (2013.01); *B41J 2/1433* (2013.01); *B41J 2/14129* (2013.01); *B41J 2/162* (2013.01); *H05K 9/0067* (2013.01); *B41J 2002/14491* (2013.01); *B41J 2202/11* (2013.01); *B41J 2202/19* (2013.01); *H05K 2201/09354* (2013.01); *H05K 2201/10681* (2013.01)

(58) Field of Classification Search
CPC .............. H05K 1/0259; H05K 9/0067; H05K 2201/09354; B41J 2/14129; B41J 2/1433; B41J 2/162; B41J 2002/14491
USPC ........................................ 257/173
See application file for complete search history.

(56) References Cited

U.S. PATENT DOCUMENTS

| | | | |
|---|---|---|---|
| 4,758,808 A | 7/1988 | Sasaki et al. | |
| 5,315,472 A | 5/1994 | Fong et al. | |
| 5,363,124 A | 11/1994 | Arway | |
| 5,434,607 A | 7/1995 | Keefe | |
| 5,861,790 A | 1/1999 | Johnson et al. | |
| 6,089,917 A * | 7/2000 | Anderson | H05K 9/0066 439/620.06 |
| 6,567,251 B1 | 5/2003 | Schulte et al. | |
| 6,921,155 B2 | 7/2005 | Sturgeon et al. | |
| 7,361,966 B2 | 4/2008 | Young et al. | |
| 7,543,904 B2 | 6/2009 | Izuo | |
| 7,654,646 B2 | 2/2010 | Tanuma | |
| 8,523,324 B2 | 9/2013 | Yamaguchi et al. | |
| 9,085,165 B2 | 7/2015 | Kinoshita et al. | |

(Continued)

FOREIGN PATENT DOCUMENTS

WO       2017027020 A1    2/2017

*Primary Examiner* — Elias Ullah
(74) *Attorney, Agent, or Firm* — Duft & Bornsen, PC

(57) ABSTRACT

Systems and methods are provided for cover plates for printheads. One embodiment is an apparatus that includes a cover plate for a printhead. The cover plate includes multiple layers of electrically conductive material, a layer of nonconductive ferrite that is sandwiched between the multiple layers, and at least one connector that penetrates through the multiple layers and the layer of nonconductive ferrite to form a conductive pathway for electric current between the multiple layers through the layer of nonconductive ferrite. The cover plate also includes at least one opening that penetrates through the multiple layers and the layer of nonconductive ferrite, and that is configured to align with nozzles of the printhead.

6 Claims, 9 Drawing Sheets

(56) References Cited

U.S. PATENT DOCUMENTS

2017/0028723 A1    2/2017   Lutnesky et al.
2017/0100930 A1    4/2017   Oohashi et al.
2017/0190176 A1    7/2017   Kudo et al.

* cited by examiner

COVER PLATES THAT ATTENUATE ELECTROSTATIC DISCHARGE AT PRINTHEADS

FIELD OF THE INVENTION

The invention relates to the field of printing, and in particular, to printheads.

BACKGROUND

Entities with substantial printing demands typically use a production printer. A production printer is a high-speed printer used for volume printing, such as a continuous-forms printer that prints on a web of print media stored on a large roll. A production printer typically includes a localized print controller that manages the overall operation of the printer, and a marking engine (sometimes referred to as an "imaging engine" or a "print engine"). The marking engine includes one or more arrays of printheads.

Upon receiving a print job, the print controller rasterizes logical pages of the job (e.g., to create bitmaps representing each page of the job), and the marking engine operates individual printheads to mark the web based on the rasterized logical pages. Thus, the printer marks physical pages based on the digital information of the print job.

During printing, the web may become electrostatically charged as it moves underneath the nozzles of the printheads. This is undesirable, because electrostatic discharges between the web and the nozzles may result in currents and/or fields that either damage electronic systems that control the nozzles or produce electrical noise that cause undesired behaviors of the nozzles. Thus, those skilled in the art continue to seek out new techniques and systems for reducing the strength and/or frequency of electrostatic discharges from the web to the printheads of a printer.

SUMMARY

Embodiments described herein provide cover plates that are disposed between the nozzles of a printhead and the web, and that attenuate electrostatic discharges proceeding from the web towards the printhead. The cover plates may for example include conductive layers that sandwich a highly nonconductive layer of ferrite which attenuates the amperage of incoming discharges. Connectors may be placed between the conductive layers in order to direct current flow through the nonconductive layer of ferrite.

One embodiment is an apparatus that includes a cover plate for a printhead. The cover plate includes multiple layers of electrically conductive material, a layer of nonconductive ferrite that is sandwiched between the multiple layers, and at least one connector that penetrates through the multiple layers and the layer of nonconductive ferrite to form a conductive pathway for electric current between the multiple layers through the layer of nonconductive ferrite. The cover plate also includes at least one opening that penetrates through the multiple layers and the layer of nonconductive ferrite, and that is configured to align with nozzles of the printhead.

A further embodiment is a system that includes a printer. The printer includes a marking engine having multiple printheads. Each printhead includes a cover plate that mitigates electrostatic discharge from print media to circuitry that controls the printhead. Each cover plate includes multiple layers of electrically conductive material, a layer of nonconductive ferrite that is sandwiched between the multiple layers, and at least one connector that penetrates through the multiple layers and the layer of nonconductive ferrite to form a conductive pathway for electric current between the multiple layers through the nonconductive layer of ferrite. Each cover plate also includes at least one opening that penetrates through the multiple layers and the layer of nonconductive ferrite. The printer also includes a print controller that directs operations of the marking engine during printing.

Other illustrative embodiments (e.g., methods and computer-readable media relating to the foregoing embodiments) may be described below.

DESCRIPTION OF THE DRAWINGS

Some embodiments of the present invention are now described, by way of example only, and with reference to the accompanying drawings. The same reference number represents the same element or the same type of element on all drawings.

DETAILED DESCRIPTION

The figures and the following description illustrate specific illustrative embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
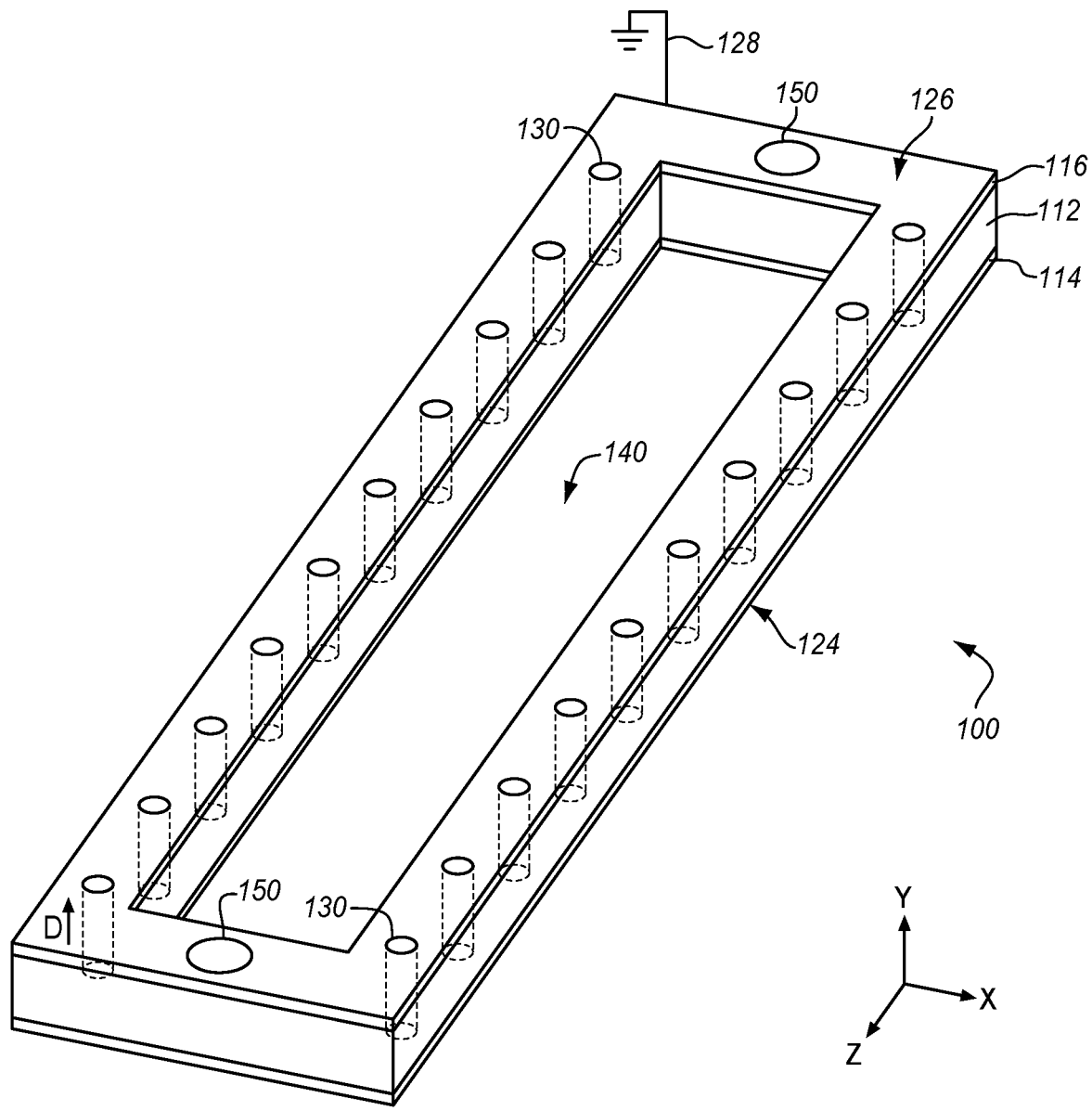
FIG. 1 is a perspective view of a cover plate for a printhead in an illustrative embodiment.

FIG. 1 is a block diagram of a cover plate 100 for a printhead in an illustrative embodiment. Cover plate 100 serves to protect nozzles of a printhead within opening 140 from physical interference. Cover plate 100 has been enhanced in order to attenuate and redirect electrical energy from an electrostatic discharge (ESD) traveling towards the nozzles. In this embodiment, cover plate 100 includes a conductive layer 114 having a surface 124 that faces print media, and a conductive layer 116 having a surface 126. Conductive layer 116 is electrically coupled to a ground voltage, and paths to ground from conductive layer 114 pass through layer 112 of nonconductive ferrite into conductive layer 116. Hence, conductive layer 114 is less directly coupled to ground than conductive layer 116. Conductive layers 114 and 116 are electrically coupled by connectors 130 (e.g., copper conductors), which pass through layer 112 of nonconductive ferrite. Electrical energy from an ESD event proceeds from conductive layer 114, through connectors 130 along direction D into conductive layer 116, and through a conductor 128 towards the ground voltage. In further embodiments any suitable number of conductors 128 may be placed around the periphery of layer 116 and connect towards the ground voltage. When electrical energy passes through layer 112, layer 112 attenuates the amperage of the electrical energy. This also dampens any electrical and/or magnetic fields generated by the electrical energy, which beneficially helps to shield electrical components of the nozzles. FIG. 1 also depicts mounting holes 150, which may enable cover plate 100 to be screwed into a corresponding printhead.

Conductive layer 114 and conductive layer 116 may comprise a layer of metallization, such as copper plating having a thickness between one half ounce and two ounces per square foot. Layer 112 may comprise ferrite such as nickel zinc or manganese zinc, and may have a volume resistivity between 500 million and 1.5 billion ohms per square centimeter. In one embodiment, connectors 130 may have outer/inner diameters of 18 mils/16 mils that enable an ampacity of 2.56 Amps per connector, when the length of the connector is 60 mils. If the inner diameter of this connector is decreased to 14 mils, then the ampacity of each connector is increased to about 4.4 Amps. The ampacity of each connector is based upon the outer diameter, inner diameter, as well as the length of the connector. In further embodiments, any suitable connector length, inner diameter, and outer diameter may be utilized to meet desired amperage requirements. Meanwhile, an opening 140 may have a cross section of one inch by two inches in size, or may be larger or smaller. Further details of the configuration of cover plate 100 with respect to other components of a printing system are provided in FIGS. 2-4.

Figure 2:
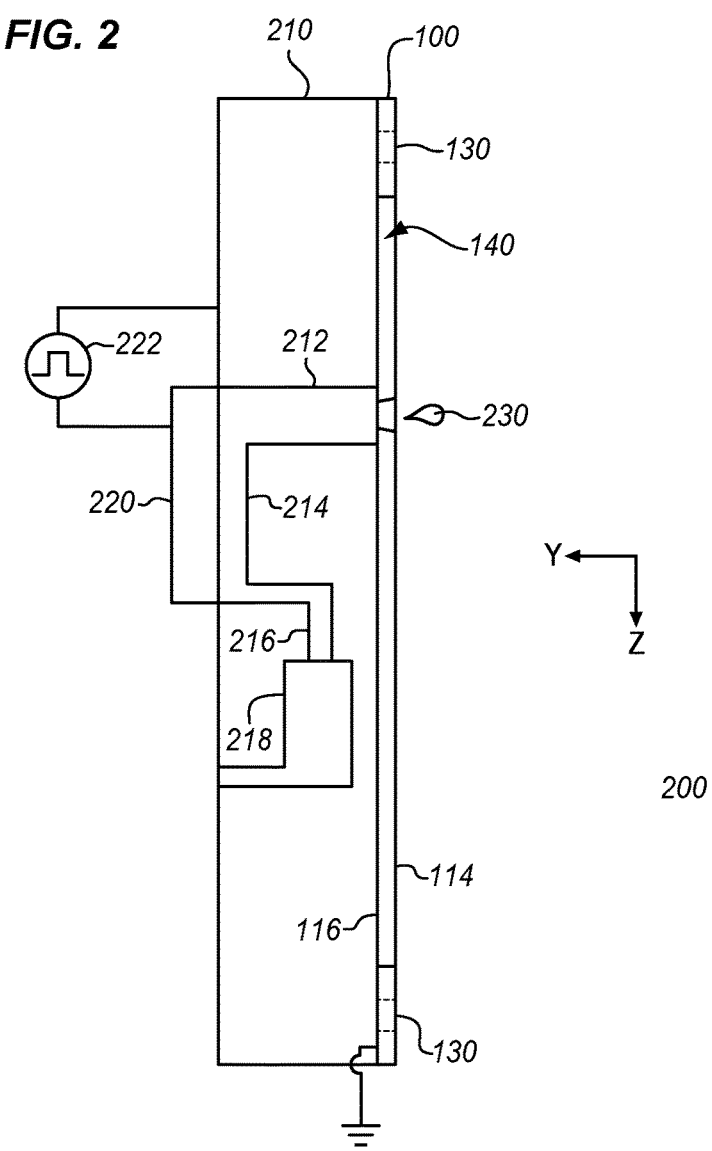
FIG. 2 is a side view of a cover plate attached to a printhead in an illustrative embodiment.

FIG. 2 is a side view of a cover plate 100 attached to a printhead 200 in an illustrative embodiment. As shown in FIG. 2, printhead 200 includes body 210, to which cover plate 100 is mounted. Layer 114 of cover plate 100 faces outward towards print media, while layer 116 of cover plate 100 is concealed by body 210. Body 210 houses multiple nozzles 212, which each eject droplets 230 of ink through opening 140 of cover plate 100 (i.e., nozzles 212 are aligned with opening 140). A piezoceramic 220 drives a nozzle 212 by elastically deforming pressure chamber 214. Meanwhile, ink is supplied to nozzle 212 via inlet 216 and manifold 218. Circuitry 222 controls the operations of piezoceramic 220 to ensure that a corresponding nozzle ejects appropriate amounts of ink at appropriate times. ESD that strikes a nozzle 212 would conduct through circuitry 222 to ground, which is undesirable. Fortunately, the conductive layers of cover plate 100 provide a lower resistance current path to ground than nozzles 212, which ensures that ESD strikes cover plate 100 instead of nozzles 212.

Figure 3:
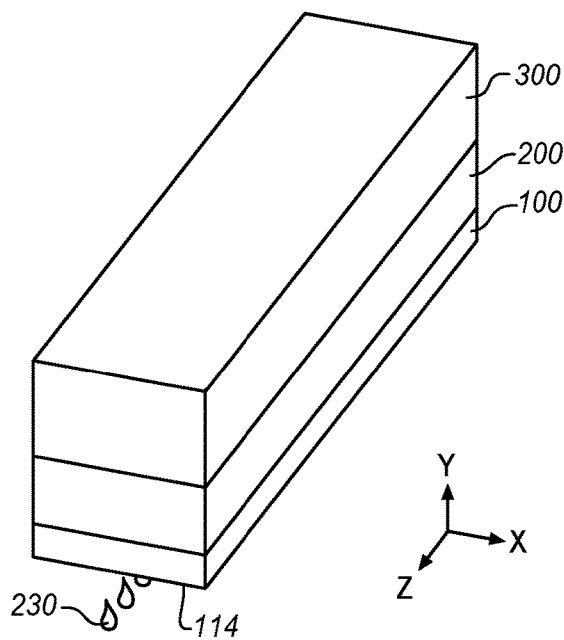
FIG. 3 is a perspective view of a printhead in an illustrative embodiment.

FIG. 3 is a perspective view of a printhead 200 in an illustrative embodiment. As shown in FIG. 3, nozzles may eject multiple droplets 230 of ink through cover plate 100, and layer 114 of cover plate 100 faces print media (and hence will receive ESD). FIG. 3 also illustrates a housing 300 which may store circuitry 222, electrical connectors (e.g., Universal Serial Bus (USB) interfaces, ribbon cable interfaces, etc.), and other components. One or more printheads 200 may be integrated into a marking engine of a printer in order to facilitate printing.

Figure 4:
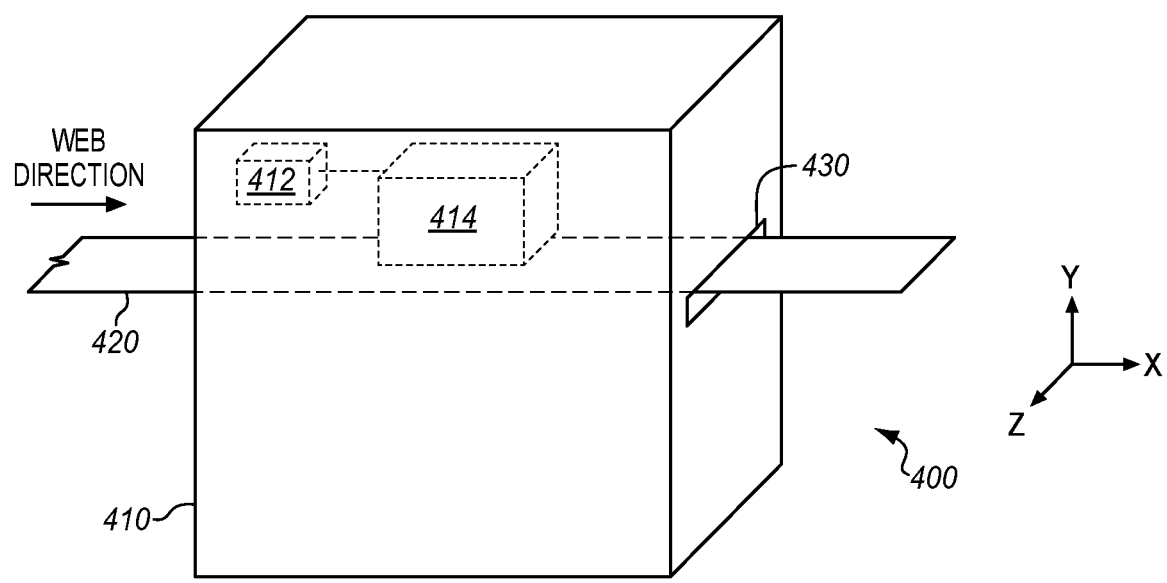
FIG. 4 is a perspective view of a printing system that includes multiple printheads in an illustrative embodiment.

FIG. 4 is a perspective view of a printing system 400 that includes multiple printheads in an illustrative embodiment. In this embodiment, printing system 400 comprises printer 410, which receives a web 420 of continuous-forms print media. In other embodiments printing system 400 may operate on cut-sheet print media. Print media may be paper, textiles or any other printable medium. Controller 412 controls the operations of marking engine 414 in order to ensure that digital print data is accurately represented by markings onto web 420. Marking engine 414 includes multiple printheads which each eject droplets of ink in accordance with instructions from controller 412. Marked portions of web 420 exit the printer 410 via channel 430, and then may be cut, bound, or otherwise processed as desired for a given print job. Controller 412 may be implemented as custom circuitry, as a hardware processor executing programmed instructions, etc. Controller 412 may be included within printer 410 or may be separate and distinct from printer 410.

The particular arrangement, number, and configuration of components described herein is illustrative and non-limiting. Illustrative details of the operation of cover plate 100 will be discussed with regard to FIG. 5. Assume, for this embodiment, that an operator has installed multiple cover plates 100 onto printheads 200 within marking engine 414 of printer 410. Printer 410 receives a print job from a customer. Controller 412 rasterizes the print job and provides instructions to marking engine 414. Marking engine 414 initiates printing, and web 420 is driven through printer 410 during the printing process. The motion of web 420 builds up electrostatic energy at web 420.

Figure 5:
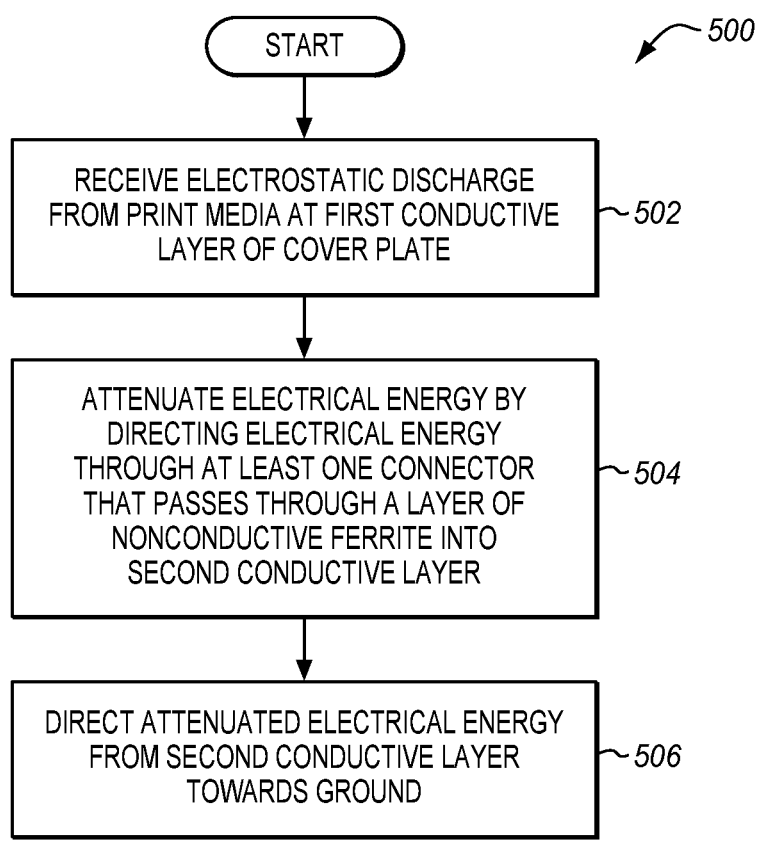
FIG. 5 is a flowchart illustrating a method for operating a cover plate for a printhead in an illustrative embodiment.

FIG. 5 is a flowchart illustrating a method 500 for operating a cover plate 100 in an illustrative embodiment. The steps of method 500 are described with reference to printer 410 of FIG. 1, but those skilled in the art will appreciate that method 500 may be performed for other printers. The steps of the flowcharts described herein are not all inclusive and may include other steps not shown. The steps described herein may also be performed in an alternative order.

FIG. 5 is a flowchart illustrating a method 500 for operating a cover plate 100 for a printhead 200 in an illustrative embodiment. According to method 500, an ESD is generated at web 420. The ESD arcs across an air gap between web 420 and a printhead 200 (e.g., an airgap ranging between less than a millimeter and a few millimeters). Because conductive layer 114 of cover plate 100 is conductive and provides a conductive pathway to ground, the ESD is favorably directed to cover plate 100 instead of a nozzle 212 of printhead 200. Thus, in step 502, conductive layer 114 of cover plate 100 receives an ESD from web 420 of print media. The ESD proceeds towards ground, and may split its current across multiple connectors 130 as it moves towards ground. In step 504, cover plate 100 attenuates electrical energy from the ESD by directing the electrical energy through at least one of the connectors 130 that passes through layer 112 of nonconductive ferrite. The amperage of the electrical energy is attenuated by this passage, and hence is reduced by the time that conductive layer 116 is reached. In step 506, attenuated electrical energy is directed from conductive layer 116 through conductor 128 towards a ground voltage. In this manner, each ESD is beneficially redirected so that it does not flow through circuitry 222 for a nozzle 212. Additionally, because electrical energy from an ESD is attenuated, electrical and/or magnetic fields generated by the ESD are also attenuated, and hence the impact of these fields on circuitry 222 is also reduced.

Figure 6:
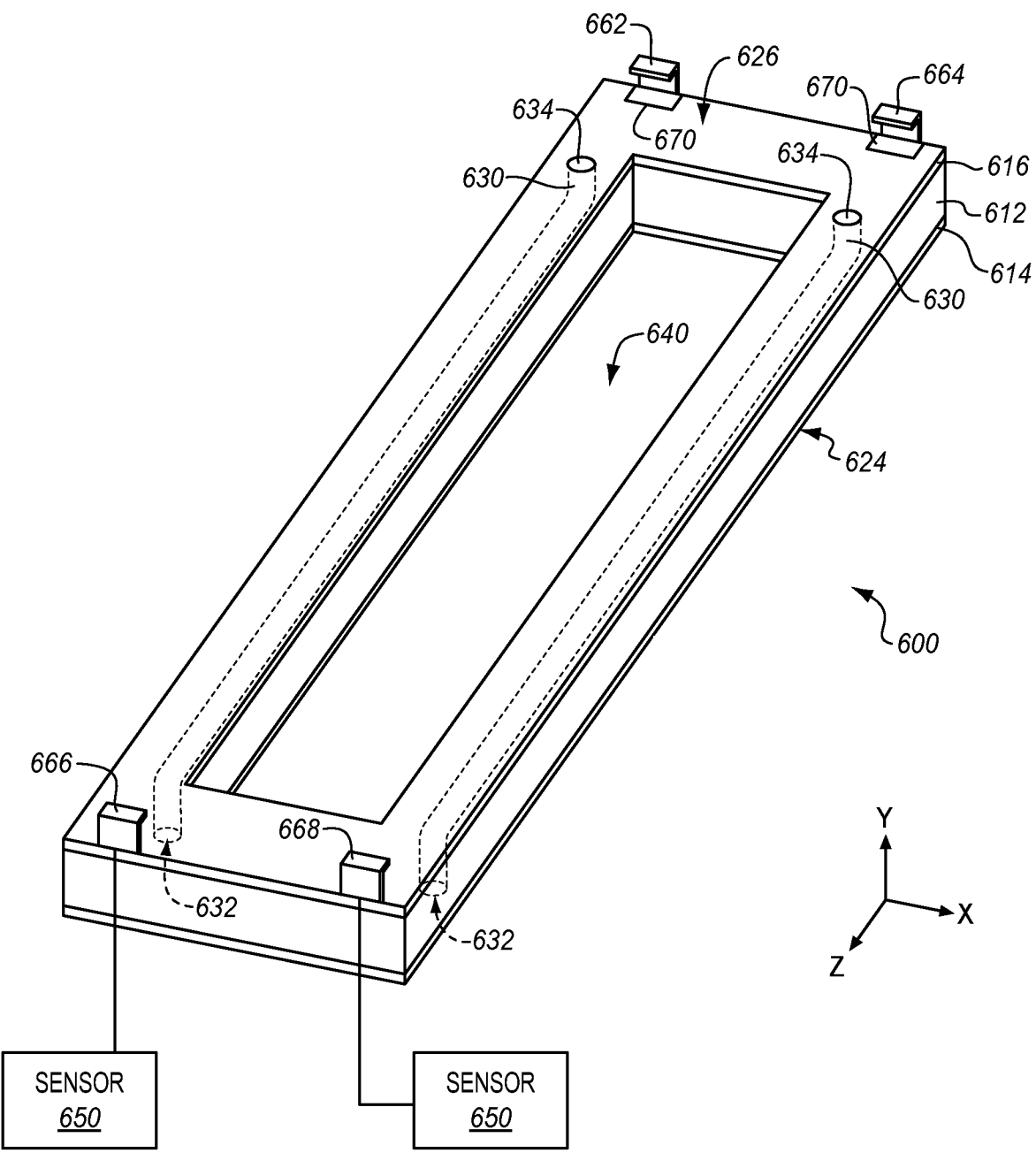
FIGS. 6-9 are perspective views of alternate versions of cover plates for printheads in illustrative embodiments.
Figure 7:
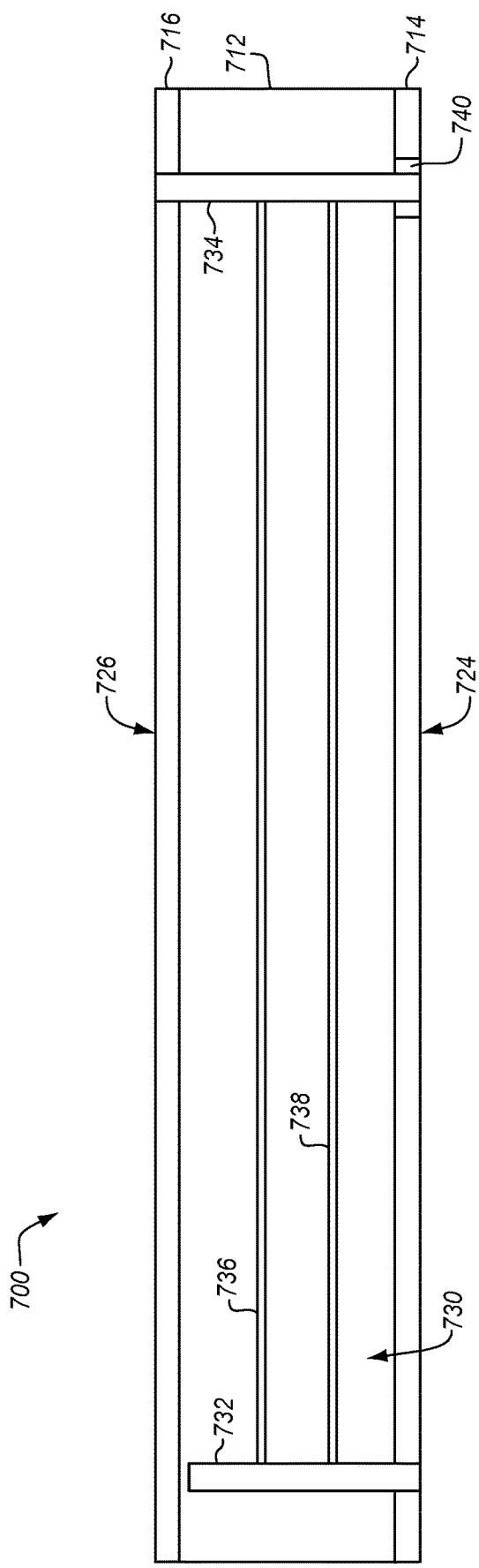
Figure 8:
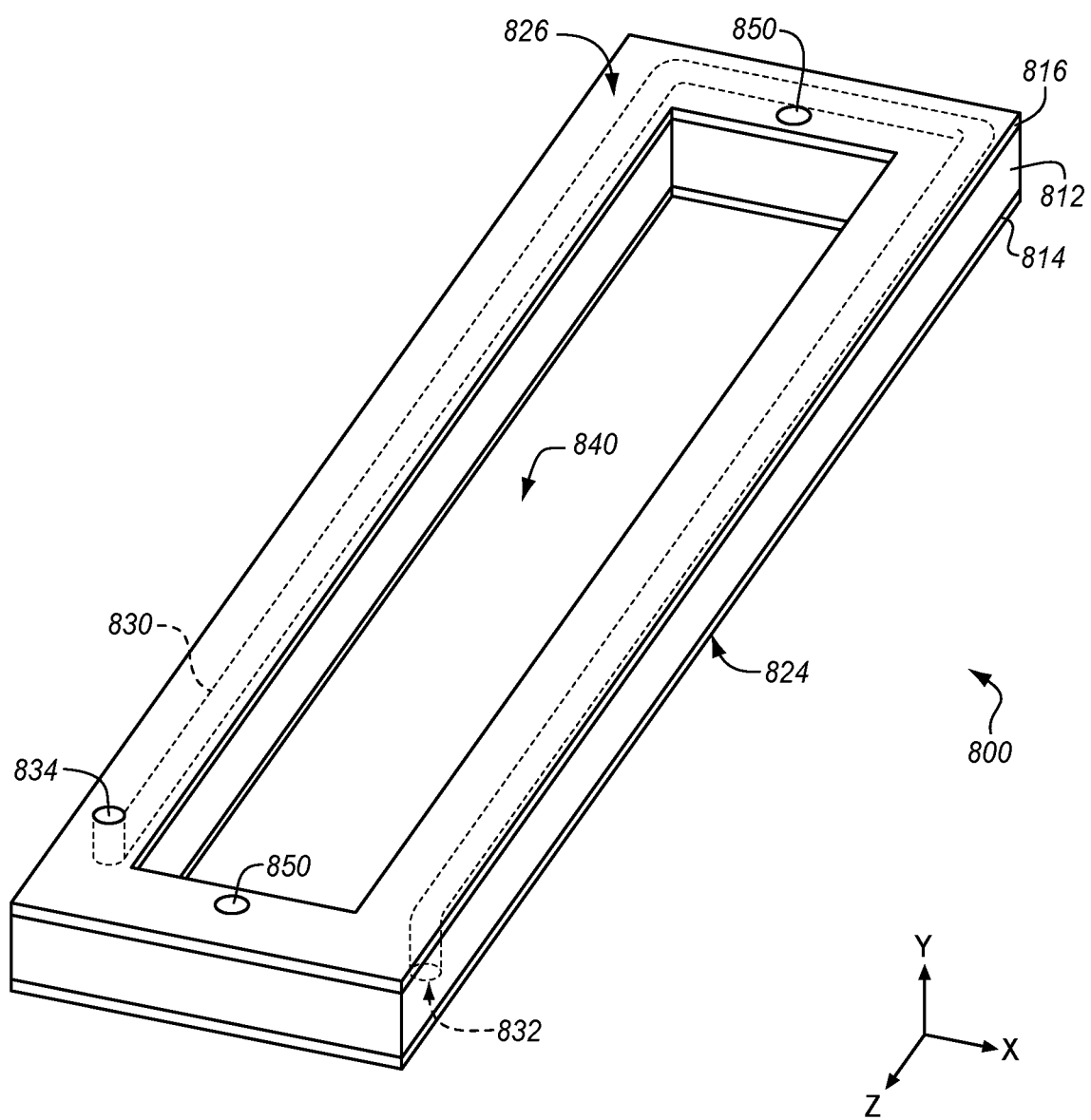

FIGS. 6-8 illustrate further embodiments of enhanced cover plates in illustrative embodiments. Specifically, FIG.

6 is a perspective view of an alternate cover plate 600 for a printhead in an illustrative embodiment. Cover plate 600 utilizes connectors 630 that change direction within a layer 612 of nonconductive ferrite. Each connector 630 extends vertically (e.g., along Y) from location 632, extends laterally (e.g., along the XZ plane), and then extends vertically again (e.g., along Y) to reach location 634. This extends the path length of connectors 630 within layer 612, which in turn increases attenuation provided by connectors 630. Because fewer connectors are utilized in cover plate 600 than cover plate 100, the width of each connector 630 may be increased in order to enable each connector 630 to bear a higher amount of current. In further embodiments, multiple lateral traces (e.g., along the XZ plane) between paired connectors 630 may be implemented for redundancy or for carrying higher levels of current if desired. Cover plate 600 also includes conductive layer 616 that is coupled with ground and has surface 626, as well as conductive layer 614 that has surface 624 and that faces print media. In this embodiment, cover plate 600 includes prongs 660 that protrude outward from ends of cover plate 600. The prongs 662-668 can enable the cover plate 600 to connect to the ground voltage while also enabling the interchangeability of cover plate 600. Cover plate 600 further includes opening 640 which is aligned with nozzles of the printhead.

FIG. 6 also depicts sensors 650, which are electrically coupled with prongs 662-668 and may be used to detect resistances between prongs 662-668. In this embodiment, prong 662 and prong 664 are electrically coupled with conductive layer 614, and are electrically isolated from conductive layer 616 via insulators 670. Meanwhile, prong 666 and prong 668 are electrically coupled with conductive layer 616, and are electrically isolated from conductive layer 614. Each sensor 650 measures a resistance between prongs, such as a resistance between prong 662 and prong 666, or a resistance between prong 664 and prong 668. When both connectors 630 fail, then a measured resistance would exceed a predetermined value that would then cause a signal to be sent to the controller that would then be used to initiate a service call to replace cover plate 600. In short, if the electrical properties of cover plate 600 have changed, then it may be inferred that one or more connectors 630 have failed, and that cover plate 600 might be replaced. When both connectors have failed, then the electrical properties of cover plate 600 will significantly change, indicating that cover plate 600 needs to be replaced. Circuitry 222 may use sensors 650 to determine when connectors 630 within cover plate 600 have failed and may send a signal to the controller for the printer to indicate that a service call is desired to replace cover plate 600.

FIG. 7 is a side view of an alternate cover plate 700. As shown in FIG. 7, cover plate 700 includes conductive layer 714 having surface 724, and conductive layer 716 having surface 726. Cover plate 700 also includes at least one connector 730 having a complex geometry within a layer 712 of nonconductive ferrite. Connector 730 includes conductive post 732, which contacts conductive layer 714 and extends towards conductive layer 716 without touching conductive layer 716. In this manner, post 732 acts as a buried via. In a similar fashion, conductive post 734 contacts conductive layer 716 and extends towards conductive layer 714 without touching conductive layer 714. Conductive post 734 operates as a feedthrough cylinder that traverses an entire thickness of cover plate 700, but conductive post 734 does not contact layer 714 because it is separated via a gap 740 in layer 714. The diameter of gap 740 may be dimensioned to ensure that capacitive coupling between post 734 and layer 714 remains negligibly small, such as 0.1 picofarads or less. Such an implementation may facilitate sensing resistances between conductive layer 714 and conductive layer 716. In further embodiments, any suitable posts may be implemented as feed through cylinders, or as buried vias. Conductive rails 736 and 738 contact posts 732 and 734. While only two rails are depicted in FIG. 7, any suitable number may be used. The arrangement depicted in FIG. 7 beneficially provides desired redundancy while also increasing the ampacity of connector 730. For a given high amperage, the widths of rails 736 and 738 may be designed to be smaller than when only one rail is used, therefore, minimizing the amount of volume occupied by connector 730 within layer 712 of nonconductive ferrite. Furthermore, for a given moderate amperage, if one of the rails fails, the other available rail can perform current-carrying. This feature reduces the frequency at which cover plate 700 should be replaced, extending the lifetime of cover plate 700 and reducing labor.

FIG. 8 is a perspective view of a further alternate cover plate 800 for a printhead in an illustrative embodiment. Cover plate 800 utilizes connector 830 that changes direction within a layer 812 of nonconductive ferrite. Connector 830 proceeds vertically along Y from location 832, proceeds laterally along Z, proceeds laterally along X, again proceeds laterally along Z, and then proceeds vertically along Y to reach location 834. This extends the path length of connector 830 within layer 812, which in turn increases attenuation provided by connector 830. Because only one connector is utilized in cover plate 800, the width of connector 830 may be increased in order to enable connector 830 to bear a higher amount of current. Cover plate 800 also includes conductive layer 814 having surface 824, and conductive layer 816 having surface 826. In this embodiment, cover plate 800 includes mounting holes 850 that protrude outward from ends of cover plate 800. Cover plate 800 further includes opening 840 which is aligned with nozzles of the printhead.

Figure 9:
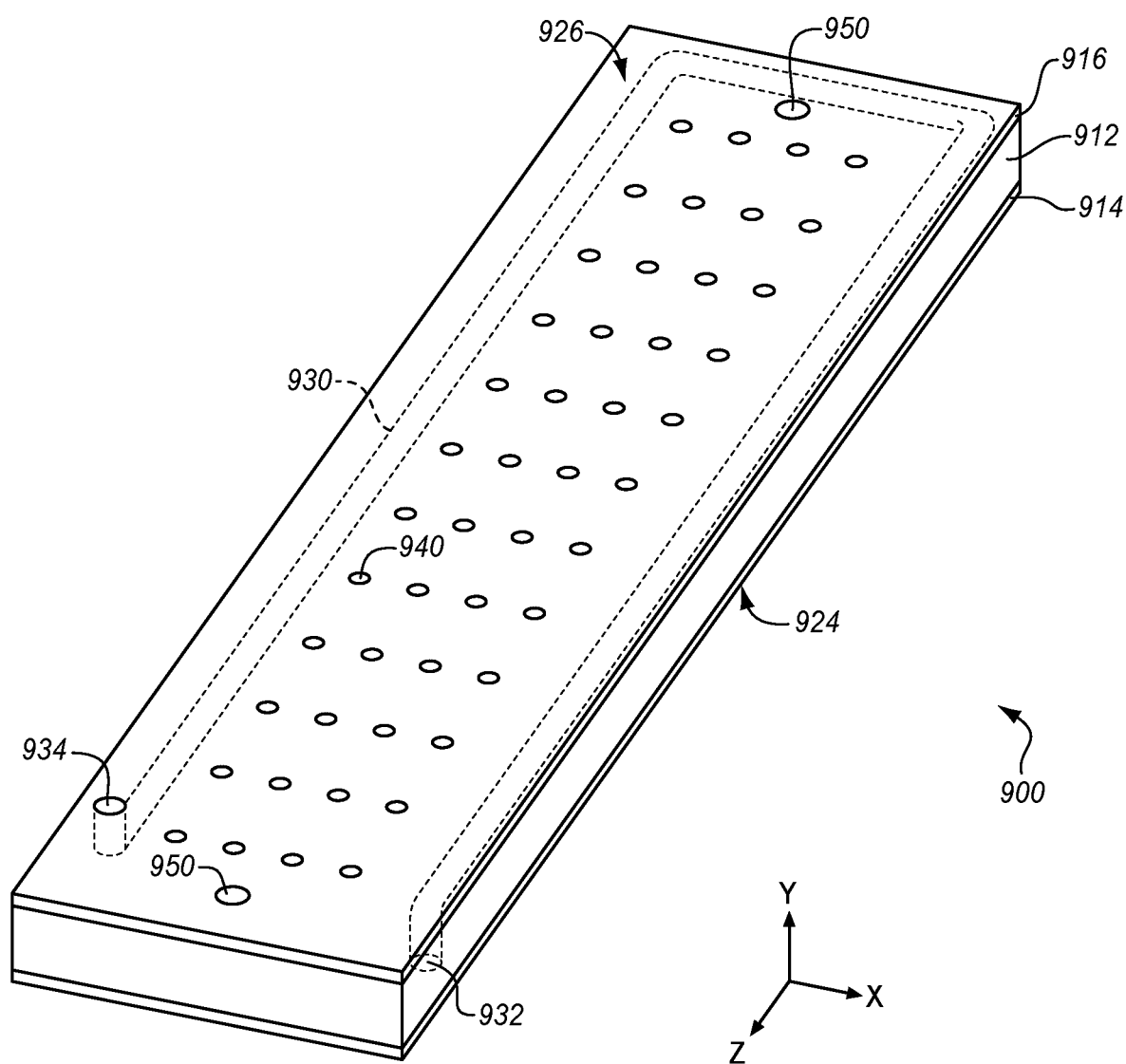

FIG. 9 is a perspective view of a further alternate cover plate 900 for a printhead in an illustrative embodiment. Cover plate 900 utilizes multiple openings 940 which are each aligned with a separate nozzle of a printhead. Specifically, cover plate 900 utilizes grid of openings 940 that are each less than an eighth of an inch in diameter in this embodiment. Connector 930 changes direction within a layer 912 of nonconductive ferrite. Specifically, connector 930 proceeds vertically along Y from location 932, proceeds laterally along Z, proceeds laterally along X, again proceeds laterally along Z, and then proceeds vertically along Y to reach location 934. This extends the path length of connector 930 within layer 912, which in turn increases attenuation provided by connector 930. Because only one connector is utilized in cover plate 900, the width of connector 930 may be increased in order to enable connector 930 to bear a higher amount of current. Cover plate 900 also includes conductive layer 914 having surface 924, and conductive layer 916 having surface 926. In this embodiment, cover plate 900 includes mounting holes 950 that protrude outward from ends of cover plate 900.

Figure 10:
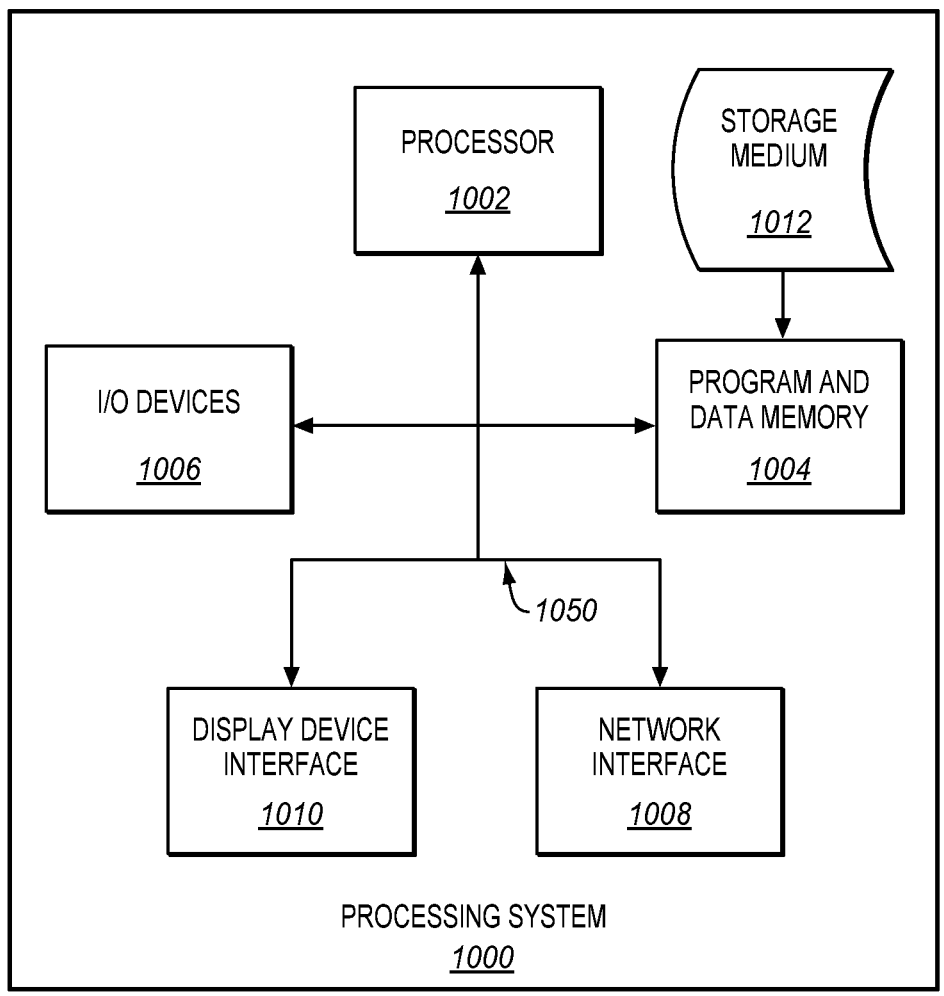
FIG. 10 illustrates a processing system operable to execute a computer readable medium embodying programmed instructions to perform desired functions in an illustrative embodiment.

In one particular embodiment, software is used to direct a processing system of controller 412 to perform the various operations disclosed herein. FIG. 10 illustrates a processing system 1000 operable to execute a computer readable medium embodying programmed instructions to perform desired functions in an illustrative embodiment. Processing system 1000 is operable to perform the above operations by executing programmed instructions tangibly embodied on computer readable storage medium 1012. In this regard, embodiments of the invention can take the form of a computer program accessible via computer-readable medium 1012 providing program code for use by a computer or any other instruction execution system. For the purposes of this description, computer readable storage medium 1012 can be anything that can contain or store the program for use by the computer.

Computer readable storage medium 1012 can be an electronic, magnetic, optical, electromagnetic, infrared, or semiconductor device. Examples of computer readable storage medium 1012 include a solid state memory, a magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

Processing system 1000, being suitable for storing and/or executing the program code, includes at least one processor 1002 coupled to program and data memory 1004 through a system bus 1050. Program and data memory 1004 can include local memory employed during actual execution of the program code, bulk storage, and cache memories that provide temporary storage of at least some program code and/or data in order to reduce the number of times the code and/or data are retrieved from bulk storage during execution.

Input/output or I/O devices 1006 (including but not limited to keyboards, displays, pointing devices, etc.) can be coupled either directly or through intervening I/O controllers. Network adapter interfaces 1008 may also be integrated with the system to enable processing system 1000 to become coupled to other data processing systems or storage devices through intervening private or public networks. Modems, cable modems, IBM Channel attachments, SCSI, Fibre Channel, and Ethernet cards are just a few of the currently available types of network or host interface adapters. Display device interface 1010 may be integrated with the system to interface to one or more display devices, such as printing systems and screens for presentation of data generated by processor 1002.

Although specific embodiments were described herein, the scope of the invention is not limited to those specific embodiments. The scope of the invention is defined by the following claims and any equivalents thereof.

What is claimed is:

1. A system comprising:
   a printer comprising:
      a marking engine comprising multiple printheads, each printhead including a cover plate that mitigates electrostatic discharge from print media to circuitry that controls the printhead, each cover plate comprising:
         multiple layers of electrically conductive material;
         a layer of nonconductive ferrite that is sandwiched between the multiple layers;
         at least one connector that penetrates through the multiple layers and the layer of nonconductive ferrite to form a conductive pathway for electric current between the multiple layers through the nonconductive layer of ferrite; and
         at least one opening that penetrates through the multiple layers and the layer of nonconductive ferrite; and
      a print controller that directs operations of the marking engine during printing.

2. The system of claim 1 wherein:
   for each cover plate, the at least one connector extends perpendicularly through a first of the multiple layers into the layer of nonconductive ferrite, extends in-plane through the layer of nonconductive ferrite, and extends perpendicularly through the layer of nonconductive ferrite into a second of the multiple layers.

3. The system of claim 1 wherein:
   for each cover plate, the multiple layers comprise copper plating having a thickness between one half ounce and two ounces per square foot.

4. The system of claim 1 wherein:
   for each cover plate, a width of the at least one connector is between one tenth of an inch and one half of an inch.

5. The system of claim 1 wherein:
   for each cover plate, the nonconductive ferrite is selected from the group consisting of nickel zinc and manganese zinc.

6. The system of claim 1 wherein:
   for each cover plate, at least one of the multiple layers is electrically coupled with a ground voltage.

* * * * *